United States Patent [19]

Kawauchi et al.

[11] Patent Number: 4,810,095
[45] Date of Patent: Mar. 7, 1989

[54] LASER-BEAM, PATTERN DRAWING/INSPECTING APPARATUS

[75] Inventors: Yasunobu Kawauchi, Tokyo; Koji Handa, Numazu, both of Japan

[73] Assignee: Toshiba Machine Co., Ltd., Tokyo, Japan

[21] Appl. No.: 935,729

[22] Filed: Nov. 28, 1986

[30] Foreign Application Priority Data

Nov. 29, 1985 [JP] Japan ................ 60-268584

[51] Int. Cl.$^4$ .............................. C01B 7/00
[52] U.S. Cl. ................... 356/394; 356/431; 356/398
[58] Field of Search ........... 356/394, 431, 398; 250/556; 346/108

[56] References Cited

U.S. PATENT DOCUMENTS

| | | | |
|---|---|---|---|
| 4,271,334 | 6/1981 | Yardy | 346/108 |
| 4,566,016 | 1/1986 | Masuda | 346/108 |
| 4,651,169 | 3/1987 | Muka | 346/108 |

FOREIGN PATENT DOCUMENTS 80759  5/1983  Japan ........................... 250/556

Primary Examiner—Richard A. Rosenberger
Attorney, Agent, or Firm—Oblon, Fisher, Spivak, McClelland & Maier

[57] ABSTRACT

A laser-beam, pattern drawing/inspecting apparatus comprises a reciprocating stage for supporting a printed substrate having an etchant-resistant resist layer coated on it, a laser-beam scanning device having a laser for selectively emitting a first laser beam and a second laser beam less intense than the first laser beam, and an optical system for guiding the first and second laser beams to the printed substrate along the same optical path, the first laser beam scanning the resist layer to draw a pattern thereon, and the second laser beam scanning the resist layer, and a pattern inspection device for receiving the second laser beam reflected from the resist layer, thereby to optically inspect the pattern drawn on the resist layer.

1 Claim, 3 Drawing Sheets

LASER-BEAM, PATTERN DRAWING/INSPECTING APPARATUS

BACKGROUND OF THE INVENTION

The present invention relates to an apparatus for applying a laser beam to a resist layer formed on a printed substrate or the like, thereby forming a resist pattern and then inspecting the resist pattern.

Recently a laser-beam, pattern drawing apparatus has been developed which can draw a pattern on a resist layer formed on a printed substrate or the like. The apparatus applies a laser beam to the resist layer, while the printed substrate is being continuously moved in one direction. The laser beam is repeatedly deflected such that the beam spot moves on the resist layer, back and forth along a line extending at right angles to the direction in which the substrate is moved.

The apparatus can indeed draw a pattern on the resist layer, but cannot develop the pattern or etch the resist layer to form a resist pattern. In order to form a resist pattern, the printed substrate must undergo the steps of developing the pattern and etching the resist layer. Moreover, the substrate must be subjected to the step of inspecting the resist pattern. Consequently, the efficieny of forming resist patterns is low. Therefore, it has been demanded that an apparatus which can not only draw a pattern on a resist layer, but also develop the pattern and etch the resist layer, thereby to form a resist pattern, be provided for a practical use.

SUMMARY OF THE INVENTION

It is an object of the present invention to provide a laser-beam, pattern drawing/inspecting apparatus which can draw a pattern on a resist layer and form a resist pattern at high speed, and which can also inspect the resist pattern by performing operations similar to those carried out in drawing the pattern, immediately after the resist pattern has been formed.

DETAILED DESCRIPTION OF THE PREFERRED EMBODIMENTS

An embodiment of the present invention will now be described with reference to the drawings attached hereto.

Figure 1:
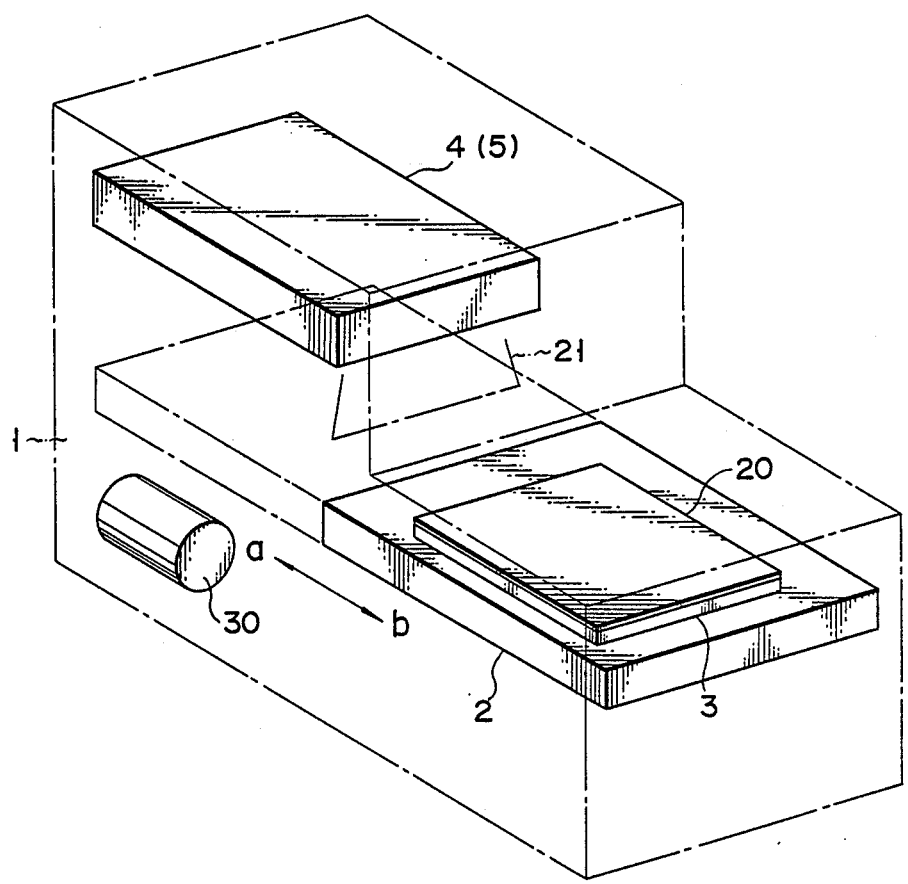
FIG. 1 is a perspective view showing a laser-beam, pattern drawing, inspecting apparatus according to one embodiment of this invention.

As is shown in FIG. 1, a laser-beam, pattern drawing/inspecting apparatus comprises housing 1 and stage 2. Stage 2 is provided within housing 1, and can be moved back and forth by drive mechanism 30 of the known type, in the directions of arrows "a" and "b". Printed substate 3 is horizontally mounted on stage 2. Substrate 3 has a copper layer on its upper surface. Resist, which is etchant-resistant or volatile, has been coated on the copper layer, thus forming resist 20 having a thickness of about $2\mu$. This resist is a mixture of a resin such as nitrocellulose or PMMA (polymethyl methacrylate) and oil black, a near-infrared ray-absorbing agent, or the like. Laser-beam scanning device 4 and pattern inspection device 5 are provided above the path in which stage 2 can move.

Figure 2:
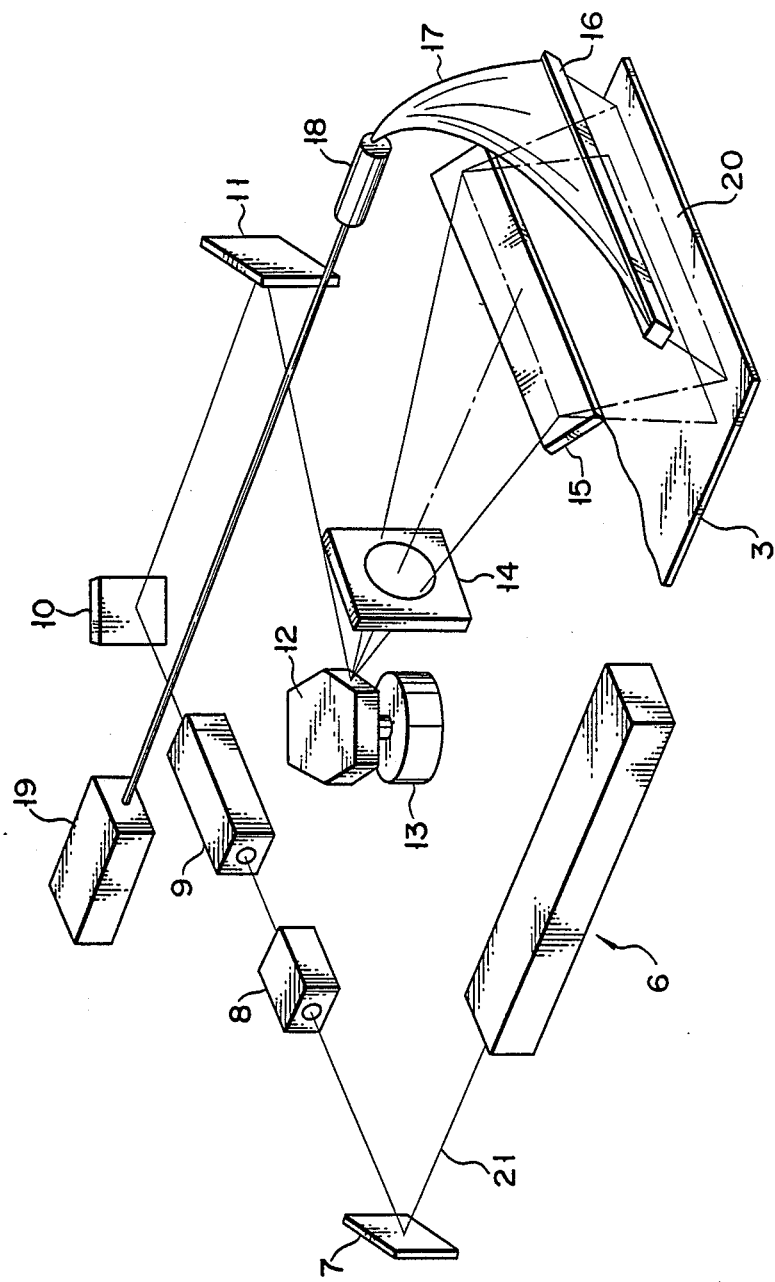
FIG. 2 is a perspective view showing the laser-beam scanning device and pattern inspection device, both used in the apparatus shown in FIG. 1.

FIG. 2 shows the structures of laser-beam scanning device 4 and pattern inspection device 5. Laser 6 is provided to emit a laser beam. Laser beam 21 emitted from laser 6 is reflected 90° on first mirror 7, and further passes through an optical path. Modulation element 8, beam expander 9 and second mirror 10 are provided in this optical path. Beam 21 passes first through modulation element 8 and then through beam expander 9. It is again reflected by 90° on second mirror 10. Laser beam 21 is further reflected by third mirror 11 and guided to polygon mirror 12. Mirror 12 is a hexagonal prism having six vertical faces. Its six vertical faces are mirror-polished. Polygon mirror 12 can be rotated by motor 13 to repeatedly deflect laser beam 21 such that a beam spot moves on resist layer 20, right or left along a line extending at right angles to the direction in which substrate 3 is moved. In front of polygon mirror 12 there are provided f-$\theta$ lens 14 and reflecting mirror 15. Reflecting mirror 15 is horizontally positioned, hence extending in parallel to substrate 3. Mirror 15 is rectangular, and its axis extends at right angles to the direction in which substrate 3 is moved. Mirror 15 can rotate about its axis, so that it can take a first position during the process of drawing a pattern on resist layer 20, and a second position during the process of inspecting the resist pattern. More specifically, in the second position, mirror 15 applies laser beam 21 vertically onto printed substrate 3; in the second position, mirror 15 applies laser beam 21 slantwise onto substrate 3. Cylindrical lens 16 is provided in parallel to reflecting mirror 15. Lens 16 is so located that beam 21 reflected from substrate 3 during the pattern-inspecting process passes through it. The output face of cylindrical lens 16 is coupled by optical fibers 17 to optical amplifier 18. Optical amplifier 18 is optically connected to signal-processing circuit 19. Signal-processing circuit 19 is of the known type which processes optical input signals to reproduce the pattern drawn in resist layer 20, so that the pattern can be compared with a reference pattern.

Figure 3:
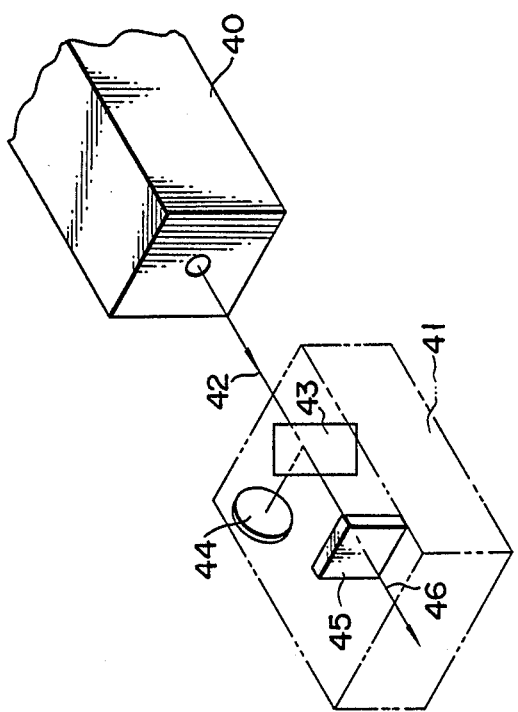
FIG. 3 is a perspective view of the laser used in the apparatus of FIG. 1.

Laser 6 will be described in greater detail with reference to FIG. 3.

Laser 6 has YAG laser head 40 whose average power is 70 W. YAG laser head 40 can emit first laser beam 42 which has a wavelength of 1.06 $\mu$m and which will be used to draw a pattern on resist layer 20. Inspection unit 41 can be located on the optical axis of laser head 40. Unit 41 is set away from the optical axis of laser head 40 during the pattern-drawing process, and is arranged on the optical axis during the pattern-inspecting process. Inspection unit 41 has half-mirror 43 and beam-absorbing plate 44. Half-mirror 43 passes part of first laser beam 42 and guides the same to first mirror 7, and reflects the remaining part of first laser beam 42 to absorbing plate 44. A less intense laser beam is thereby applied to mirror 7 during the process of inspecting the resist pattern. Beam-absorbing plate 44 absorbs that part of beam 42 which has beeen reflected by half-mirror 43. Frequency-doubling unit 45 is provided in the path of the beam output by half-mirror 43. Unit 45 outputs second laser beam 46 whose intensity is less than first laser beam 42 but whose frequency is twice the frequency of first laser beam 43. As has been stated, second laser beam 46 is applied to first mirror 7. When it is necessary to more reduce the energy of second laser beam 46, it suffices to set another half-mirror on the optical axis of YAG laser head 40.

It will now be explained how a pattern is drawn on resist layer 20 formed on printed substrate 3.

First, stage 2 supporting printed substrate 3 on its surface is moved by drive mechanism 30 in the direction of arrow "a". When the portion of stage 2, and hence the left side portion in the area to be patterned, of substrate 3 each the position right below laser-beam scanning device 4, laser 6 is turned on. Laser 6 emits laser beam 21. Beam 21 is reflected by first mirror 7, passes through modulation element 8 and beam expander 9, reflected by second mirror 10 and by third mirror 11, and finally applied to polygon mirror 12. Polygon mirror 12 is rotated. Beam 21 is therefor deflected by polygon mirror 12, and is then guided to reflecting mirror 15 by f-θ lens 14. Beam 21 is subsequently applied from mirror 15 to printed substrate 3, thus scanning resist layer 20 along parallel lines extending at right angles to the direction in which substrate 3 is being moved. Those portions of resist layer 20 which have been illuminated with laser beam 21 evaporate, thereby exposing the corresponding portions of the copper layer. A pattern is thereby drawn on resist layer 20, and a resist pattern is formed. Therefore, printed substrate 3 need not be subjected to a pattern-developing step or resist-etching step. That is to say, the copper layer of substrate 3 can be etched immediately.

It will be explained how the resist pattern thus formed is inspected.

At first, inspection unit 41 is set on the optical axis of YAG laser head 40. As a result, second laser beam 46 can be applied from unit 41 to first mirror 7. Simultaneously, reflecting mirror 15 is rotated about its axis and set in its second position. Thereafter, stage 2 is moved in the direction of arrow "b" (FIG. 1), which is opposite to the direction of arrow "a" in which stage 2 is moved during the pattern-drawing process. Second laser beam 46 is applied slantwise onto resist layer 20 after it has been guided by the same optical system as first laser beam 42 has been guided to resist layer 20. As polygon mirror 12 rotates, second laser beam 46 scans resist layer 20. Beam 46 is reflected from resist layer 20 and applied to cylindrical lens 16. It is, therefore, supplied through optical fibers 17 to optical amplifier 18, and farther to signal-processing circuit 19. Since resist layer 20 and the copper layer have different reflectivities, those segments of beam 46 reflected from resist layer 20 have an intensity different from the intensity of those segments of beam 46 which have been reflected from the exposed postions of the copper layer. Hence, optical amplifier 18 can output optical signals at different levels representing the resist pattern. Signal-processing circuit 19 compares the reference pattern data, on the one hand, with these optical signals, the data showing the beam scanning direction and the data showing the position of stage 2, on the other hand. Circuit 19, can therefore, inspect the resist pattern to determine whether or not this pattern has been accurately drawn and formed.

Secod laser beam 46, which is used to inspect the resist pattern, is continuous. In other words, YAG laser head 40 is continuously excited throughout the pattern-inspecting process.

Laser 6 has a single laser head, i.e., YAG laser head 40. Laser 6 can be replaced by the laser shown in FIG. 4 which as two laser heads, one for the pattern-drawing process, and the other for the pattern-inspecting process.

Figure 4:
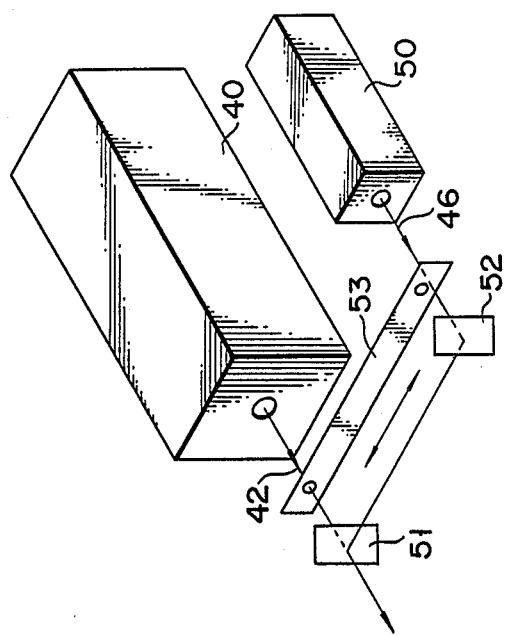
FIG. 4 is a perspective view of another laser which can be employed in the apparatus in FIG. 1.

The laser of FIG. 4 comprises first and second laser heads 40 and 50. First laser head 40 is the same as YAG laser head 40 shown in FIG. 3, and emits laser beam 42 for drawing a pattern on resist layer 20. Half-mirror 51 is set on the optical axis of first laser head 40. First laser beam 42 is supplied through half-mirror 51 to the optical system shown in FIG. 2. Second laser head 50 is provided beside first laser head 40. Laser head 50 is a He-Ne gas laser whose output is 15 mW and which emits second laser beam 46 having a wavelength of 623.8 nm. Mirror 52 is set on the optical axis of second laser head 50, in order to guide second laser beam 46 to half-mirror 51. Second laser beam 46 guided by mirror 52 is reflected by half-mirror 51 and eventually applied to the optical system (FIG. 2). Selective light shield 53 is provided in front of first and second laser heads 40 and 50. Shield 53 has two through holes, and can take the first position (shown in FIG. 4) during the pattern-drawing process and the second position during the pattern-inspecting process. The holes are located such that the first hole allows the passage of first laser beam 42 when shield 53 stays in the first position, and the second hole allows the passage of second laser beam 46 when shield 53 remains in the second position.

As has been described, the apparatus of the present invention can draw a pattern on a resist layer and can form a resist pattern at high speed, without subjecting the resist layer to a pattern-developing step or an etching step, and also can inspect the resist pattern immediately after the pattern has been formed. The present invention can, therefore, help to enhance the efficiency of forming and inspecting resist patterns.

What is claimed is:

1. A laser-beam, pattern drawing/inspecting apparatus comprising:
   a reciprocating stage for supporting a sample having an etchant-resistant resist layer coated on it;
   a drive mechanism for reciprocating said stage;
   a laser-beam scanning device having a laser for selectively emitting a first laser beam and a second laser beam less intense than the first laser beam, and an optical system for guiding the first and second laser beams to the sample along the same optical path, said first laser beam scanning the resist layer to draw a pattern thereon, and said second laser beam scanning the resist layer;
   a pattern inspection device for receiving the second laser beam reflected from the resist layer, thereby to optically inspect the pattern drawn on the resist layer;
   wherein said laser has a laser head for emitting the first laser beam, and an inspection unit which can be set on the optical axis of the laser head and which reduces the energy of the first laser beam, thereby to provide the second laser beam, when set in the optical axis of the laser head; and
   wherein said inspection unit has a beam-splitting member for splitting the first laser beam into two parts and supplying the first part to said optical system and the second part along a path, and a beam-absorbing member provided in this path for absorbing the second part of the first laser beam, and a member provided in front of said optical system for changing the frequency of the first part of the first laser beam.

* * * * *